United States Patent
Derderian et al.

(10) Patent No.: US 7,204,885 B2
(45) Date of Patent: Apr. 17, 2007

(54) DEPOSITION SYSTEM TO PROVIDE PREHEATING OF CHEMICAL VAPOR DEPOSITION PRECURSORS

(75) Inventors: Garo J. Derderian, Boise, ID (US); Gordon Morrison, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 160 days.

(21) Appl. No.: 10/209,840

(22) Filed: Jul. 31, 2002

(65) Prior Publication Data

US 2002/0188376 A1    Dec. 12, 2002

Related U.S. Application Data

(62) Division of application No. 09/642,976, filed on Aug. 18, 2000, now Pat. No. 6,451,692.

(51) Int. Cl.
 C23C 16/52   (2006.01)
 C23C 16/455  (2006.01)
 C23C 16/00   (2006.01)

(52) U.S. Cl. .................. 118/667; 118/715; 118/724; 118/666

(58) Field of Classification Search ............. 118/715, 118/724, 666, 667; 156/345.27
See application file for complete search history.

(56) References Cited

U.S. PATENT DOCUMENTS

| | | | | |
|---|---|---|---|---|
| 4,031,851 A | * | 6/1977 | Camahort | 118/718 |
| 4,522,674 A | * | 6/1985 | Ninomiya et al. | 156/345.35 |
| 4,535,000 A | | 8/1985 | Gordon | 427/160 |
| 4,629,635 A | | 12/1986 | Brors | 427/255.2 |
| 4,717,596 A | * | 1/1988 | Barbee et al. | 427/248.1 |
| 4,897,709 A | | 1/1990 | Yokoyama et al. | 357/68 |
| 4,920,908 A | | 5/1990 | Brors et al. | 427/255.2 |
| 4,947,789 A | * | 8/1990 | Hussla et al. | 118/715 |
| 5,015,503 A | * | 5/1991 | Varrin et al. | 117/99 |
| 5,094,977 A | | 3/1992 | Yu et al. | 437/174 |
| 5,116,784 A | * | 5/1992 | Ushikawa | 438/488 |
| 5,186,120 A | * | 2/1993 | Ohnishi et al. | 118/667 |
| 5,188,979 A | | 2/1993 | Filipiak | 438/653 |
| 5,203,925 A | * | 4/1993 | Shibuya et al. | 118/724 |

(Continued)

FOREIGN PATENT DOCUMENTS

EP    0128169 B1    7/1990

(Continued)

OTHER PUBLICATIONS

"Jacket", Webster's II New Riverside University Dictionary, The Riverside Publishing Company, p. 649.*

*Primary Examiner*—Jeffrie R. Lund
(74) *Attorney, Agent, or Firm*—Schwegman, Lundberg, Woessner & Kluth, P.A.

(57) ABSTRACT

Chemical vapor deposition systems include elements to preheat reactant gases prior to reacting the gases to form layers of a material on a substrate, which provides devices and systems with deposited layers substantially free of residual compounds from the reaction process. Heating reactant gases prior to introduction to a reaction chamber may be used to improve physical characteristics of the resulting deposited layer, to improve the physical characteristics of the underlying substrate and/or to improve the thermal budget available for subsequent processing.

50 Claims, 5 Drawing Sheets

U.S. PATENT DOCUMENTS

| | | | |
|---|---|---|---|
| 5,254,499 A | 10/1993 | Sandhu et al. | 437/192 |
| 5,279,857 A | 1/1994 | Eichman et al. | 427/255 |
| 5,308,655 A | 5/1994 | Eichman et al. | 427/248.1 |
| 5,318,633 A * | 6/1994 | Yamamoto et al. | 118/725 |
| 5,378,501 A | 1/1995 | Foster et al. | |
| 5,431,733 A * | 7/1995 | Shibuya et al. | 118/715 |
| 5,431,958 A | 7/1995 | Desu et al. | |
| 5,458,688 A * | 10/1995 | Watanabe | 118/724 |
| 5,467,113 A * | 11/1995 | Ishinaga et al. | 347/17 |
| 5,567,483 A | 10/1996 | Foster et al. | 427/535 |
| 5,571,572 A | 11/1996 | Sandhu | 427/585 |
| 5,630,878 A * | 5/1997 | Miyamoto et al. | 118/715 |
| 5,674,574 A | 10/1997 | Atwell et al. | 427/561 |
| 5,730,804 A * | 3/1998 | Gomi et al. | 118/726 |
| 5,741,546 A | 4/1998 | Sandhu | 427/255.1 |
| 5,741,547 A | 4/1998 | Akram et al. | 427/255.2 |
| 5,840,368 A * | 11/1998 | Ohmi | 427/255.4 |
| 5,892,886 A | 4/1999 | Sandhu | 392/416 |
| 5,943,471 A | 8/1999 | Atwell | 392/386 |
| 5,946,594 A | 8/1999 | Iyer et al. | 438/648 |
| 5,989,345 A * | 11/1999 | Hatano | 118/715 |
| 6,055,927 A * | 5/2000 | Shang et al. | 118/723 ME |
| 6,056,823 A * | 5/2000 | Sajoto et al. | 118/715 |
| 6,107,152 A | 8/2000 | Derderian | 438/381 |
| 6,129,043 A * | 10/2000 | Lai et al. | 118/715 |
| 6,133,159 A | 10/2000 | Vaartstra et al. | 438/758 |
| 6,143,081 A * | 11/2000 | Shinriki et al. | 118/719 |
| 6,147,011 A | 11/2000 | Derderian et al. | 438/783 |
| 6,159,855 A | 12/2000 | Vaartstra | 438/681 |
| 6,165,834 A | 12/2000 | Agarwal et al. | 438/240 |
| 6,177,145 B1 | 1/2001 | Derderian et al. | 427/535 |
| 6,180,541 B1 | 1/2001 | Joo | 438/785 |
| 6,188,097 B1 | 2/2001 | Derderian et al. | 257/306 |
| 6,206,971 B1 * | 3/2001 | Umotoy et al. | 118/715 |
| 6,210,485 B1 * | 4/2001 | Zhao et al. | 118/724 |
| 6,244,575 B1 * | 6/2001 | Vaartstra et al. | 261/141 |
| 6,268,019 B1 | 7/2001 | Florczak | 427/166 |
| 6,364,954 B2 | 4/2002 | Umotoy et al. | 118/715 |
| 6,365,229 B1 * | 4/2002 | Robbins | 427/248.1 |
| 6,428,850 B1 * | 8/2002 | Shinriki et al. | 427/255.32 |
| 6,444,039 B1 * | 9/2002 | Nguyen | 118/715 |
| 6,451,692 B1 * | 9/2002 | Derderian et al. | 438/680 |
| 6,454,860 B2 * | 9/2002 | Metzner et al. | 118/715 |
| 6,811,651 B2 * | 11/2004 | Long | 156/345.27 |
| 6,845,732 B2 * | 1/2005 | Lim | 118/715 |
| 7,105,441 B2 * | 9/2006 | Derderian et al. | 438/680 |
| 2002/0195710 A1 * | 12/2002 | Derderian et al. | 257/751 |
| 2003/0032283 A1 * | 2/2003 | Derderian et al. | 438/680 |
| 2003/0079686 A1 * | 5/2003 | Chen et al. | 118/715 |
| 2003/0084848 A1 * | 5/2003 | Long | 118/715 |
| 2004/0194702 A1 * | 10/2004 | Sasaki et al. | 118/715 |
| 2005/0000425 A1 * | 1/2005 | Fairbourn | 118/715 |
| 2005/0028738 A1 * | 2/2005 | Saito et al. | 118/724 |

FOREIGN PATENT DOCUMENTS

| | | |
|---|---|---|
| EP | 1033743 A2 | 9/2000 |
| JP | 08291385 | 11/1996 |

\* cited by examiner

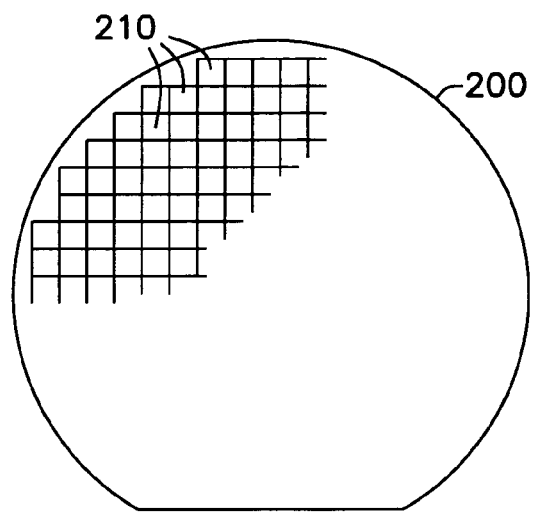
FIG. 2
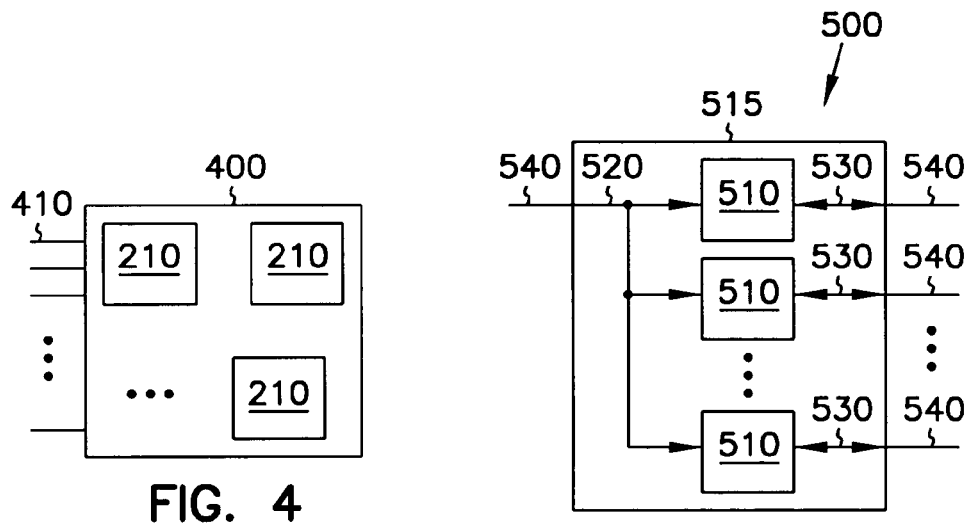
FIG. 4
FIG. 5
FIG. 6

DEPOSITION SYSTEM TO PROVIDE PREHEATING OF CHEMICAL VAPOR DEPOSITION PRECURSORS

This application is a Divisional of U.S. application Ser. No. 09/642,976, filed Aug. 18, 2000, now U.S. Pat. No. 6,451,692, which is incorporated herein by reference.

TECHNICAL FIELD

The present invention relates generally to chemical vapor deposition, and in particular to methods for chemical vapor deposition including preheating of the chemical vapor deposition precursors, systems to perform the methods, and apparatus produced by such methods.

BACKGROUND

Semiconductor integrated circuits (ICs) contain individual devices that are typically coupled together using metal line interconnects and various contacts. In many applications, the metal lines are formed on a different level than the devices, separated by an intermetal dielectric, such as silicon oxide or borophosphosilicate glass (BPSG). Commonly used metal lines include aluminum, tungsten and copper, as well as combinations of these materials with refractory metals and silicon. Interconnects used to electrically couple devices and metal lines are formed between the individual devices and the metal lines. A typical interconnect is composed of a contact hole (i.e. opening) formed in an intermetal dielectric layer over an active device region. The contact hole is often filled with a metal, such as aluminum or tungsten.

Interconnects often further contain a diffusion barrier layer sandwiched between the interconnect metal and the active device region at the bottom of the contact hole. Such layers prevent intermixing of the metal and the material from the active device region, such as silicon. Reducing intermixing generally extends the life of the device. Passive titanium nitride (TiN) layers are commonly used as diffusion barrier layers. An example may include the use of titanium nitride interposed between a silicide contact and a metal fill within a contact hole. Further uses of diffusion barrier layers may include a barrier layer interposed between a polysilicon layer and a metal layer in a gate stack of a field effect transistor.

Titanium nitride is a desirable barrier layer because it is an impermeable barrier for silicon, and because it presents a high barrier to the diffusion of other impurities. Titanium nitride has relatively high chemical and thermodynamic stability and a relatively low resistivity. Titanium nitride layers are also often used as adhesion layers, such as for tungsten films. While titanium nitride can be formed on the substrate by physical vapor deposition (PVD) or chemical vapor deposition (CVD) techniques, CVD is often the technique of choice.

CVD is a process in which a deposition surface is contacted with vapors of volatile chemical compounds, generally at elevated temperatures. The compounds, or CVD precursors, are reduced or dissociated at the deposition surface, resulting in an adherent coating of a preselected composition. In contrast to physical deposition, CVD does not require high vacuum systems and permits a wide variety of processing environments, including low pressure through atmospheric pressure, and is an accepted method for depositing homogeneous films over large areas and on non-planar surfaces.

CVD is often classified into various types in accordance with the heating method, gas pressure, and/or chemical reaction. For example, conventional CVD methods include cold-wall CVD, in which only a deposition substrate is heated; hot-wall CVD, in which an entire reaction chamber is heated; atmospheric CVD, in which reaction occurs at a pressure of about one atmosphere; low-pressure CVD (LPCVD) in which reaction occurs at pressures from about $10^{-1}$ to 100 torr; and plasma-assisted CVD (PACVD) and photo-assisted CVD in which the energy from a plasma or a light source activates the precursor to allow depositions at reduced substrate temperatures. Other classifications are known in the art.

In a typical CVD process, the substrate on which deposition is to occur is placed in a reaction chamber, and is heated to a temperature sufficient to drive the desired reaction. The reactant gases containing the CVD precursors are introduced into the reaction chamber where the precursors are transported to, and subsequently adsorbed on, the deposition surface. Surface reactions deposit nonvolatile reaction products on the deposition surface. Volatile reaction products are then evacuated or exhausted from the reaction chamber. While it is generally true that the nonvolatile reaction products are deposited on the deposition surface, and that volatile reaction products are removed, the realities of industrial processing recognize that undesirable volatile reaction products, as well as nonvolatile reaction products from secondary or side reactions, may be incorporated into the deposited layer. Integrated circuit fabrication generally includes the deposition of a variety of material layers on a substrate, and CVD may used to deposit one or more of these layers.

As an example, one LPCVD process combines titanium tetrachloride ($TiCl_4$) and ammonia ($NH_3$) to deposit titanium nitride. However, LPCVD titanium nitride using these precursors has a tendency to incorporate a large amount of residual ammonium chloride in the film. This residual ammonium chloride detrimentally effects the resistivity and barrier properties of the titanium nitride layer. Once exposed to air, the residual ammonium chloride will cause the titanium nitride layer to absorb water and to form particles, both undesirable effects. It is known that residual ammonium chloride can be reduced by the use of ammonia post-flow, or annealing in an ammonia atmosphere, subsequent to deposition. However, such post-processing leads to reduced throughput and a higher risk of particle formation. It is also known that increased reaction temperatures can be used to reduce the incorporation of residual ammonium chloride. However, this, too, is detrimental as increased processing temperatures reduce the thermal budget available for subsequent processing and often lead to undesirable dopant diffusion.

For the reasons stated above, and for other reasons stated below which will become apparent to those skilled in the art upon reading and understanding the present specification, there is a need in the art for alternative methods of chemical vapor deposition.

SUMMARY

The various embodiments of the invention include chemical vapor deposition methods, chemical vapor deposition systems to perform the methods, and apparatus produced by such chemical vapor deposition methods. The methods involve preheating one or more of the reactant gases used to form a deposited layer. The reactant gases contain at least one chemical vapor deposition precursor. Heating one or more of the reactant gases prior to introduction to the reaction chamber may be used to improve physical characteristics of the resulting deposited layer, to improve the physical characteristics of the underlying substrate and/or to improve the thermal budget available for subsequent processing. One example includes the formation of a titanium nitride layer with reactant gases containing the precursors of titanium tetrachloride and ammonia. Preheating the reactant gases containing titanium tetrachloride and ammonia can reduce ammonium chloride impurity levels in the resulting titanium nitride layer, thereby reducing or eliminating the need for post-processing to remove the ammonium chloride impurity.

For one embodiment, the invention provides a method of depositing a layer of material on a substrate. The method includes heating a reactant gas containing at least one chemical vapor deposition precursor to a temperature within approximately 150° C. of an auto-reaction temperature of each chemical vapor deposition precursor of the reactant gas, introducing the heated reactant gas to a reaction chamber containing the substrate, and reacting the reactant gas in the reaction chamber. Reacting the reactant gas involves reaction of the chemical vapor deposition precursors to deposit the layer of material on the substrate. It is recognized that additional compounds may be incorporated into the layer of material, such as nonvolatile reaction products from side reactions deposited in the layer of material as well as volatile reaction products from desired or side reaction products entrapped in the layer of material.

For another embodiment, the invention provides a method of depositing a layer of material on a substrate. The method includes heating a reactant gas containing at least one chemical vapor deposition precursor to a temperature below an auto-reaction temperature of each chemical vapor deposition precursor of the reactant gas, combining the heated reactant gas and at least one additional reactant gas, introducing the combined gases to a reaction chamber containing the substrate, and reacting the combined gases in the reaction chamber. Reacting the combined gases deposits at least the layer of material on the substrate. For yet another embodiment, the additional reactant gases are also heated prior to introduction to the reaction chamber.

For a further embodiment, the invention provides a method of depositing a layer of titanium nitride on a substrate. The method includes heating a first reactant gas containing titanium tetrachloride to a first temperature and heating a second reactant gas containing ammonia to a second temperature. The first and second temperatures are each below an auto-reaction temperature of titanium tetrachloride and ammonia. The method further includes combining the heated first and second reactant gases, introducing the combined first and second reactant gases to a reaction chamber containing the substrate, reacting the first and second reactant gases in the reaction chamber to produce titanium nitride, and depositing the titanium nitride on the substrate.

For another embodiment, the invention provides a chemical vapor deposition system. The chemical vapor deposition system includes a gas source, a reaction chamber, a gas conduit coupled between the gas source and the reaction chamber, a heater, a gas flow temperature sensor coupled to the gas conduit between the heater and the reaction chamber, and a control system coupled to the gas flow temperature sensor and the heater. The control system is adapted to adjust energy input from the heater to the gas conduit in response to data from the gas flow temperature sensor. For yet another embodiment, the chemical vapor deposition system further includes a gas flow control valve coupled to the gas conduit. For this embodiment, the control system is further coupled to the gas flow control valve and is further adapted to control an opening of the gas flow control valve in response to data from the gas flow temperature sensor.

Further embodiments of the invention include deposition methods and chemical vapor deposition systems of varying scope, as well as apparatus making use of such deposition methods and chemical vapor deposition systems.

BRIEF DESCRIPTION OF THE DRAWINGS

FIG. 2 is an elevation view of one embodiment of a wafer containing semiconductor dies.

FIG. 4 is a block diagram of one embodiment of an exemplary circuit module.

FIG. 5 is a block diagram of one embodiment of an exemplary memory module.

FIG. 6 is a block diagram of one embodiment of an exemplary electronic system.

DESCRIPTION OF THE EMBODIMENTS

In the following detailed description of the preferred embodiments, reference is made to the accompanying drawings which form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1:
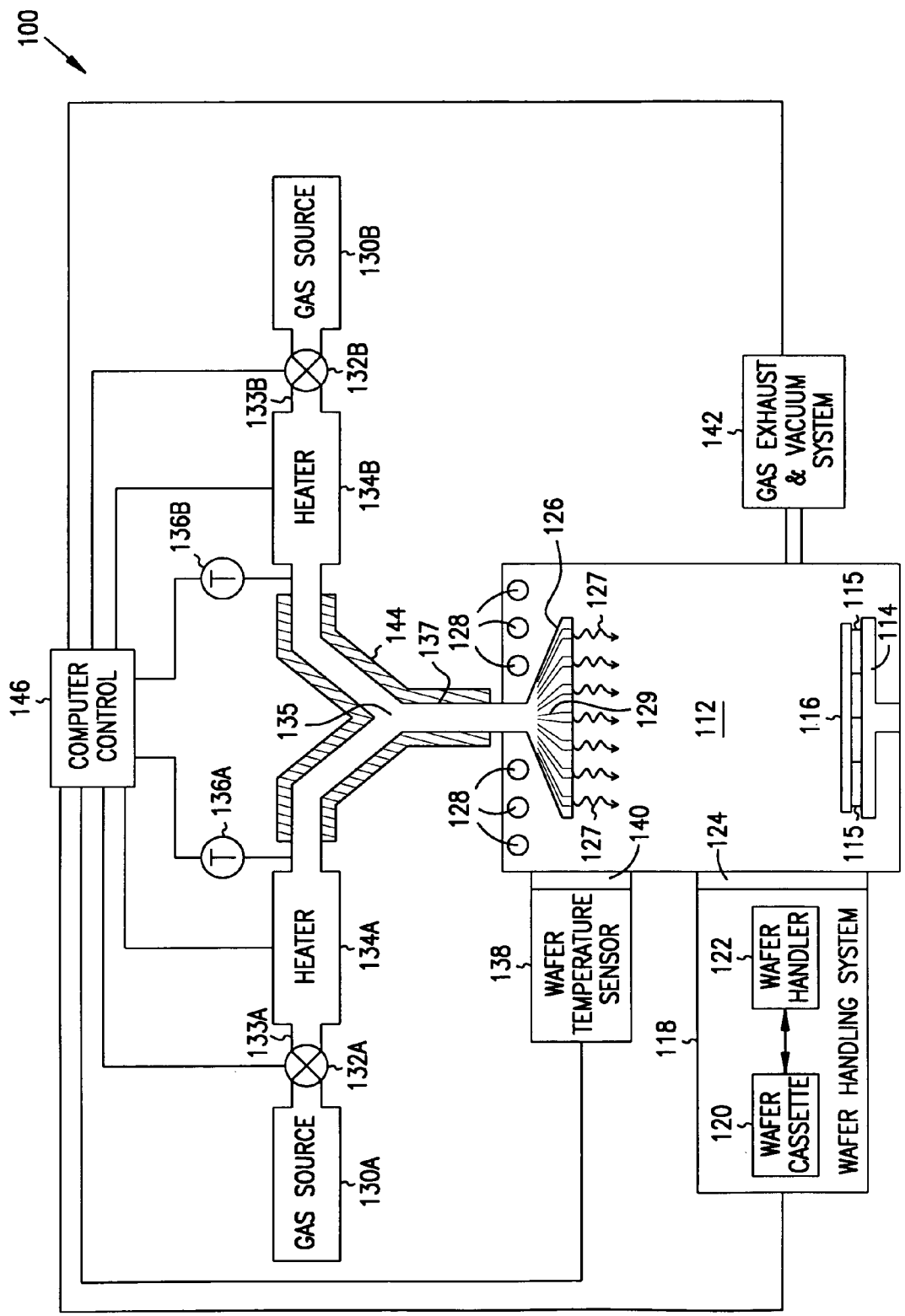
FIG. 1 is a schematic block diagram of one embodiment of a chemical vapor deposition system.

FIG. 1 shows a simplified schematic block diagram illustrating one embodiment of a Chemical Vapor Deposition (CVD) system 100 in accordance with the invention. It is to be understood that the CVD system 100 has been simplified to illustrate only those aspects of the CVD system 100 relevant for a clear understanding of the present invention, while eliminating, for the purposes of clarity, many of the elements found in a typical CVD system 100. Those of ordinary skill in the art will recognize that other elements are required, or at least desirable, to produce an operational CVD system 100. However, because such elements are well known in the art, and because they do not relate to the design which is the subject of the various embodiments, a discussion of such elements is not provided herein.

The design and construction of CVD systems is well known, and the present invention is applicable to any CVD system. The CVD system 100 for one embodiment comprises a cold wall reaction chamber 112, typically constructed of stainless steel. The bottom and sides of the reaction chamber 112 may be lined with quartz to protect the walls from film deposition during the processing steps. The walls of the reaction chamber 112 may be cooled by a circulating water jacket (not shown) in conjunction with a heat exchanger (not shown). The walls are generally maintained at or below 100° C., because higher temperatures may induce the deposition of films on the walls of the reaction chamber 112. Such depositions are undesirable because they absorb energy and effect heat distribution within the reaction chamber 112, causing temperature gradients which adversely affect the processing steps. Furthermore, depositions on walls may flake and produce particulates that can contaminate a wafer in the reaction chamber 112. However, such cooling of the walls of the reaction chamber 112 is within the discretion of the designer.

A wafer support table 114 or the like is located near the bottom of the reaction chamber 112, and is used for supporting a wafer or substrate 116. The support table 114 is generally a flat surface, typically having three or more vertical support pins 115 with low thermal mass. The support table 114 may be heated to help reduce temperature variations on the supported substrate 116.

A wafer handling system 118 is adjacent to the reaction chamber 112, and includes a wafer cassette 120 and a wafer handler 122. The wafer cassette 120 holds a plurality of wafers (substrates 116), and the wafer handler 122 transports one wafer at a time from the wafer cassette 120 to the wafer support table 114, and back again. A door 124 isolates the wafer handling system 118 from the reaction chamber 112 when the wafers are not being transported to and from the wafer support table 114.

A showerhead 126 introduces reactant gases 127 into the reaction chamber 112, and a plurality of light sources 128 heat the substrate 116. For the purposes of this description, the embodiment will be described in terms of light sources 128, although other sources of heating a substrate 116, such as RF and microwave energy, are known and applicable to the present invention. In addition, the showerhead 126 is depicted to be above the surface of substrate 116, although showerhead 126 may optionally be disposed to the side of substrate 116 as well as underneath substrate 116. Furthermore, distribution devices other than showerhead 126 may be used to introduce and distribute reactant gases 127 to the reaction chamber 112.

One or more gas sources 130A–B are coupled to the showerhead 126 to provide one or more of the reactant gases 127 to be disbursed by the showerhead 126 within the reaction chamber 112. More than one type of gas may be available from each gas source 130, and reactant gases 127 may be provided to the showerhead 126 individually or in combination.

Each reactant gas includes at least one CVD precursor. Examples of CVD precursors include titanium tetrachloride and ammonia. These precursors can be combined to deposit titanium nitride. In a pyrolysis system, the reactant gases may require only one CVD precursor. An example of such a system includes silane ($SiH_4$) which can be used to deposit silicon (Si) without further precursors. Although the term "reactant gas" is used, one or more of the reactant gases 127 may include a carrier, or non-reactive, gas. Examples of carrier gases include nitrogen ($N_2$), argon (Ar), helium (He), and other non-reactive gases used in the art of chemical vapor deposition. CVD system 100 may further include additional gas sources providing only carrier gases.

Gas flow control valves 132A and 132B control the flow of gases from gas sources 130A and 130B, respectively, through gas conduits 133A and 133B, respectively. Gas conduits represent a flow path for the reactant gases 127 between the gas sources 130 and the reaction chamber 112. Gas conduits include such things as piping between elements of the CVD system 100 as well as spaces or channels for gas flow within elements of the CVD system 100. Gas conduits 133A and 133B merge at combination node 135 to become a single gas conduit 137, thus combining the gases from gas sources 130A and 130B. Gas conduits 133A and 133B can be thought of as inputs to combination node 135, while gas conduit 137 can be thought of as an output of combination node 135. One example of combination node 135 includes a simple Y-fitting of piping making up the gas conduits. Another example of combination node 135 includes a gas manifold allowing selection of reactant and carrier gases from a variety of gas sources. Gas conduit 137 may contain a static mixer or other mixing element to improve homogeneity of the reactant gases 127. For one embodiment, the gas conduits 133A and 133B are not merged outside the reaction chamber. For this embodiment, the gases from gas sources 130A and 130B are combined subsequent to heating, but within the reaction chamber 112. One example includes a heated showerhead 126 having separate flow channels 129 for each reactant gas 127, thus heating the reactant gases 127 prior to combination in the reaction chamber 112.

Heaters 134A and 134B supply energy to the gas conduits 133A and 133B, respectively, and thus supply energy to the flow of gases from gas sources 130A and 130B, respectively. Heaters 134 may be any heater or heat exchanger capable of supplying energy to the gas conduits 133 in order to produce a rise in temperature to the gases from gas sources 130. Supplying energy to the gas conduits 133 may include passing radiation or other energy through the gas conduits 133 that is absorbed by gases within the gas conduits 133. Examples of heaters 134 include resistive heat tracing, IR radiation sources or other electric heaters as well as direct-fired, jacketed or wrapped heat exchangers. Heating thus involves raising the gas temperature above an ambient temperature.

Gas flow temperature sensors 136A and 136B sense the temperature of the flow of gases from gas sources 130A and 130B, respectively. For one embodiment, gas flow temperature sensors 136 sense the temperature of the flow of gases directly from the gas flow. For another embodiment, gas flow temperature sensors 136 sense the temperature of one or more portions of heaters 134 and derive the temperature of the flow of gases from the heater temperatures and the theoretical approach temperatures predicted by the physical characteristics of the heaters 134, conduits 133 and reactions gases 127. For one embodiment, gas flow temperature is sensed after combination of the reactant gases 127 in addition to being sensed prior to combination as depicted in FIG. 1. For a further embodiment, gas flow temperature is sensed only after combination of the reactant gases 127.

Jacket 144 may be used downstream of heaters 134 to reduce any tendency of the gases to condense prior to reaching reaction chamber 112. Jacket 144 may be a simple insulative jacket to control energy loss of reactant gases 127 by conduction. Alternatively, jacket 144 may control energy loss by supplying additional energy input to the reactant gases 127, as described with reference to heaters 134, in addition to or in lieu of providing insulation. Heaters 134 and jacket 144 maybe separate units, as depicted in FIG. 1, or they may be a single unit supplying energy to reactant gases 127 before and after combination. Although not shown in FIG. 1, jacket 144, if not merely an insulative jacket, may be coupled to the control system 146, described below, for control of energy input by jacket 144. In a similar manner, showerhead 126 may be adapted to supply energy to the reactant gases 127, as described with reference to heaters 134 and jacket 144, in addition to or in lieu of heaters 134 and jacket 144.

Jacket 144 is coupled to at least gas conduit 137 to control energy loss of reactant gases 127 between combination node 135 and reaction chamber 112. As shown in FIG. 1, jacket 144 may be further coupled to at least a portion of gas conduits 133 extending between heaters 134 and combination node 135.

Exhaust gases are removed from the reaction chamber 112, and a vacuum may be created within the reaction chamber 112, by a gas exhaust and vacuum system 142, as is well known in the art. Also present is a wafer temperature sensor 138, such as a pyrometer, which is used to measure the temperature of the substrate 116 through a window 140.

A control system 146 monitors and controls the various elements that make up the CVD system 100, such as the wafer handler 122, the gas flow control valves 132, the heaters 134, the gas flow temperature sensors 136, the wafer temperature sensor 138, and the gas exhaust and vacuum system 142. Control system 146 is in communication with the various elements of CVD system 100 such that process information is passed from these elements to control system 146 through communication lines, and process control information is passed from control system 146 to various elements of CVD system 100 through communication lines. It is noted that communications may be bidirectional across a communication line. Control system 146 may include distributed and centralized computerized industrial process control systems, as are well known in the art. Such control systems generally include a machine-readable medium containing instructions capable of causing the control system, or more directly, a processor within the control system, to monitor and control the various elements coupled to the control system. Examples of such machine-readable medium include random access memory (RAM), read only memory (ROM), optical storage mediums, magnetic tape drives, and magnetic disk drives. The machine-readable medium may be fixed, such as an installed hard drive or memory module, or removable, such as a magnetic diskette or data cartridge.

Data indicating the temperature of the substrate 116 is generated by the wafer temperature sensor 138, and is used by the control system 146 to adjust the intensity of the light sources 128 so as to produce a desired wafer temperature. Data indicating the temperature of the gas flow from gas sources 130 is generated by the gas flow temperature sensors 136, and is used by the control system 146 to adjust the energy input of heaters 134, jacket 144 (if not a simple insulative jacket) and/or the flow rate of flow control valves 132 (reductions in flow rate can be used to increase the gas flow temperature at a given energy input).

In addition, multiple wafer temperature sensors 138 may be used to sense the temperature of different regions of the substrate 116. That data may be used by the control system 146 to selectively adjust the intensity of some of the light sources 128 so as to compensate for uneven heating of the substrate 116. The control system 146 also controls when and what gases are provided to the showerhead 126, as well as when exhaust gases are removed from the reaction chamber 112, in a known manner.

The operation of the CVD system 100 will be described with reference to the deposition of titanium nitride (TiN) from titanium tetrachloride ($TiCl_4$) and ammonia ($NH_3$). However, the invention is not limited to this chemical system. Other reactant gases may utilized to form layers of TiN as well as layers having other compositions.

For one embodiment, gas source 130A provides titanium tetrachloride and gas source 130B provides ammonia. Flow control valve 132A controls the flow of titanium tetrachloride from gas source 130A as directed by control system 146 in response to a desired titanium nitride deposition rate. Flow control valve 132B controls the flow of ammonia from gas source 130B as directed by control system 146 in response to the desired titanium nitride deposition rate. Gas flow may be directly controlled by the control system 146 by producing a set opening of a flow control valve 132 based on a desired deposition rate. Alternatively, gas flow may be indirectly controlled by the control system 146 by utilizing a feedback controller (not shown) and producing a flow rate setpoint for the feedback controller which, in turn, controls the opening of a flow control valve 132. Control of gas flows may be responsive to other factors in addition to or in lieu of a desired deposition rate. As one example, flow of titanium tetrachloride may be responsive to a desired deposition rate while flow of ammonia may be responsive to a desired ammonia concentration in the reaction chamber 112. To extend this example, the flow of ammonia may have a maximum limit such that an ammonia concentration calling for ammonia flow rates above the maximum limit may direct a reduction in titanium tetrachloride flow rate despite being lower than expected for the desired deposition rate. As a further example, control of both flow rates may be responsive to desired concentrations within the reaction chamber 112.

Energy is supplied by heaters 134A and 134B to the gases from gas sources 130A and 130B, respectively, prior to combination of the gases for this embodiment. It is generally preferred to heat the gases prior to combination in order to reduce the probability of forming an adduct or inclusion complex of the gas molecules. Combining gases cold may lead to formation of an adduct. It is preferred to avoid forming an adduct as the adduct may require excessive or undesirable energy input to break the association of the individual gas molecules. Adducts having a negative effect on deposition may form between a precursor and other constituents of the reactant gases, e.g., another precursor or a carrier gas.

For one embodiment, one or more of the gases from gas sources 130A and 130B are heated to a temperature below the auto-reaction temperature, or the lowest temperature at which at least one precursor will react without further energy input, prior to introduction to the reaction chamber 112. For another embodiment, the gases from gas sources 130A and 130B are each heated to a temperature within approximately 150° C. of the auto-reaction temperature prior to introduction. For a further embodiment, the gases from gas sources 130A and 130B are each heated to a temperature within approximately 50° C. of the auto-reaction temperature prior to introduction.

For yet another embodiment, one or more of the gases from gas sources 130A and 130B are heated to a temperature at or above which they generally will not form an adduct when combined. For a further embodiment, the gases from gas sources 130A and 130B are each heated, prior to combination, to a temperature at least approximately 50° C. above the temperature at which they generally will not form an adduct. It is recognized that the auto-reaction temperature and the temperature above which the gases will generally not form an adduct are dependent upon the pressure chosen for operation of the CVD system 100.

When only one reactant gas is heated, its temperature should be chosen such that, when combined with other reactant or carrier gases, no adduct will form and auto-reaction will not occur. While temperatures approaching the auto-reaction temperature, and diverging from conditions favoring adducts, are preferred, the designer should recognize that hot spots within the heaters may lead to localized reaction if a temperature too close the auto-reaction temperature is chosen.

For one embodiment, the temperature of each reactant gas is adjusted to be substantially equal at the time of combination. For another embodiment, the range of temperatures of the reactant gases has a magnitude of at least approximately 10° C. at the time of combination. When the temperatures of the various reactant gases are not substantially equal at the time of combination, temperatures should be chosen such that, when combined, no adduct will form and auto-reaction will not occur.

For an embodiment utilizing the precursors of titanium tetrachloride and ammonia to form titanium nitride, and a CVD system 100 operating at a chamber pressure of approximately 0.2–10 torr and a substrate temperature of 450–650° C., the titanium tetrachloride and the ammonia are each heated to a temperature in the range of approximately 200–300° F. (90–150° C.) prior to combination. Typical flow rates under these conditions may be 10–50 sccm for titanium tetrachloride and 50–150 sccm for ammonia. For a specific embodiment, the chamber pressure is approximately 1 torr, the substrate temperature is approximately 580° C., the titanium tetrachloride flow rate is approximately 30 sccm and the ammonia flow rate is approximately 100 sccm. It has been reported that reaction of titanium tetrachloride and ammonia can be effected at temperatures as low as 200° C. Therefore, the substrate temperature chosen to drive the reaction at the surface of the substrate should not be confused with the auto-reaction temperature of the precursors.

For one embodiment, the temperature of the reactant gas containing the titanium tetrachloride and the temperature of the reactant gas containing the ammonia are substantially equal at the time of combination. For another embodiment, the difference between the temperature of the reactant gas containing the titanium tetrachloride and the temperature of the reactant gas containing the ammonia has a magnitude of at least approximately 10° C. at the time of combination. The temperature of the gases before and after combination is maintained by jacket 144. For one embodiment, the temperature of the gases after combination is further raised by jacket 144 in accordance with the above guidelines relating to the auto-reaction temperature, i.e., maintaining the gas temperature below the auto-reaction temperature prior to introduction to the reaction chamber 112.

The heated reactant gases 127 enter the reaction chamber 112 where the precursors are transported to the surface of the substrate 116. The reactant gases 127 react to deposit a layer of material on the surface of the substrate 116. In more detail, the precursors of the reactant gases 127 are adsorbed on the surface of the substrate 116 where they react and deposit, in this case, titanium nitride. Heating the reactant gases 127 prior to introduction to the reaction chamber 112 as described above has been shown to reduce the formation of ammonium chloride in deposited titanium nitride layers, thus reducing or eliminating the need for an ammonia post-flow procedure. Reducing the formation of impurities during deposition can also permit deposition at reduced chamber temperatures, thus reducing undesirable diffusion within the substrate and improving the thermal budget available for subsequent processing. Accordingly, reactant gas preheating may be used to improve physical characteristics of the resulting deposited layer, to improve the physical characteristics of the underlying substrate and/or to improve the thermal budget available for subsequent processing. Furthermore, a given impurity level may be attained at reduced thermal input to the substrate, thus reducing undesirable diffusion of implants in integrated circuit devices.

As noted previously, and as is well known, integrated circuit fabrication involves the deposition of a plurality of layers supported by a substrate. The CVD processes and systems described herein may be used to form one or more of these layers. Integrated circuits are typically repeated multiple times on each substrate. The substrate is further processed to separate the integrated circuits into dies as is well known in the art.

Semiconductor Dies

With reference to FIG. 2, for one embodiment, a semiconductor die 210 is produced from a wafer 200. A die is an individual pattern, typically rectangular, on a substrate that contains circuitry, or integrated circuit devices, to perform a specific function. At least one of the integrated circuit devices contains at least one CVD-deposited layer formed in accordance with the invention. For one embodiment, the CVD-deposited layer formed in accordance with the invention is a titanium nitride layer. A semiconductor wafer will typically contain a repeated pattern of such dies containing the same functionality. Die 210 may contain circuitry to extend to such complex devices as a monolithic processor with multiple functionality. Die 210 is typically packaged in a protective casing (not shown) with leads extending therefrom (not shown) providing access to the circuitry of the die for unilateral or bilateral communication and control.

One example of an integrated circuit device utilizing an embodiment of the invention in the formation of various conducting, semiconducting and insulating layers defining its circuitry is a memory device. As one specific example, memory devices may include layers of titanium nitride as diffusion barrier layers in, for example, contacts and wordlines.

Memory Devices

Figure 3:
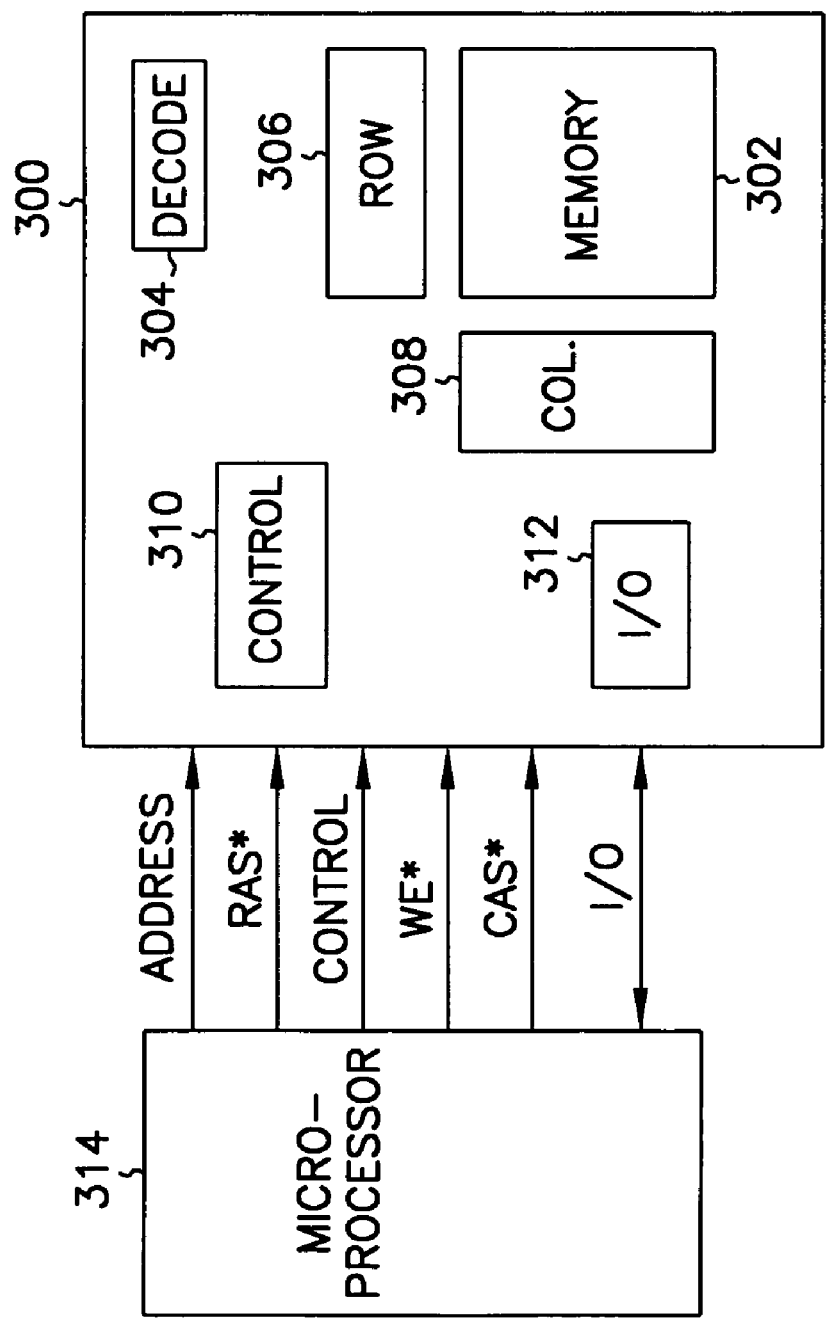
FIG. 3 is a block diagram of one embodiment of an integrated circuit memory device.

FIG. 3 is a simplified block diagram of a memory device according to one embodiment of the invention. The memory device 300 includes an array of memory cells 302, address decoder 304, row access circuitry 306, column access circuitry 308, control circuitry 310, and Input/Output circuit 312. The memory can be coupled to an external microprocessor 314, or memory controller for memory accessing. The memory receives control signals from the processor 314, such as WE*, RAS* and CAS* signals. The memory is used to store data which is accessed via I/O lines. It will be appreciated by those skilled in the art that additional circuitry and control signals can be provided, and that the memory device of FIG. 3 has been simplified to help focus on the invention. The circuitry of memory device 300 includes at least one CVD-deposited layer formed in accordance with the invention. For one embodiment, the CVD-deposited layer formed in accordance with the invention is a titanium nitride layer.

It will be understood that the above description of a DRAM (Dynamic Random Access Memory) is intended to provide a general understanding of the memory and is not a complete description of all the elements and features of a DRAM. Further, the invention is equally applicable to any size and type of memory circuit and is not intended to be limited to the DRAM described above. Other alternative types of devices include SRAM (Static Random Access Memory) or Flash memories. Additionally, the DRAM could be a synchronous DRAM commonly referred to as SGRAM (Synchronous Graphics Random Access Memory), SDRAM (Synchronous Dynamic Random Access Memory), SDRAM II, and DDR SDRAM (Double Data Rate SDRAM), as well as Synchlink or Rambus DRAMs and other emerging DRAM technologies.

Circuit Modules

As shown in FIG. 4, two or more dies 210 may be combined, with or without protective casing, into a circuit module 400 to enhance or extend the functionality of an individual die 210. Circuit module 400 may be a combination of dies 210 representing a variety of functions, or a combination of dies 210 containing the same functionality. One or more dies 210 of circuit module 400 contain at least one CVD-deposited layer formed in accordance with the invention. For one embodiment, the CVD-deposited layer formed in accordance with the invention is a titanium nitride layer.

Some examples of a circuit module include memory modules, device drivers, power modules, communication modems, processor modules and application-specific modules, and may include multilayer, multichip modules. Circuit module 400 may be a subcomponent of a variety of electronic systems, such as a clock, a television, a cell phone, a personal computer, an automobile, an industrial control system, an aircraft and others. Circuit module 400 will have a variety of leads 410 extending therefrom and coupled to the dies 210 providing unilateral or bilateral communication and control.

FIG. 5 shows one embodiment of a circuit module as memory module 500. Memory module 500 contains multiple memory devices 510 contained on support 515, the number depending upon the desired bus width and the desire for parity. Memory module 500 accepts a command signal from an external controller (not shown) on a command link 520 and provides for data input and data output on data links 530. The command link 520 and data links 530 are connected to leads 540 extending from the support 515. Leads 540 are shown for conceptual purposes and are not limited to the positions shown in FIG. 5.

Electronic Systems

FIG. 6 shows an electronic system 600 containing one or more circuit modules 400. Electronic system 600 generally contains a user interface 610. User interface 610 provides a user of the electronic system 600 with some form of control or observation of the results of the electronic system 600. Some examples of user interface 610 include the keyboard, pointing device, monitor or printer of a personal computer; the tuning dial, display or speakers of a radio; the ignition switch, gauges or gas pedal of an automobile; and the card reader, keypad, display or currency dispenser of an automated teller machine. User interface 610 may further describe access ports provided to electronic system 600. Access ports are used to connect an electronic system to the more tangible user interface components previously exemplified. One or more of the circuit modules 400 may be a processor providing some form of manipulation, control or direction of inputs from or outputs to user interface 610, or of other information either preprogrammed into, or otherwise provided to, electronic system 600. As will be apparent from the lists of examples previously given, electronic system 600 will often contain certain mechanical components (not shown) in addition to circuit modules 400 and user interface 610. It will be appreciated that the one or more circuit modules 400 in electronic system 600 can be replaced by a single integrated circuit. Furthermore, electronic system 600 may be a subcomponent of a larger electronic system.

Figure 7:
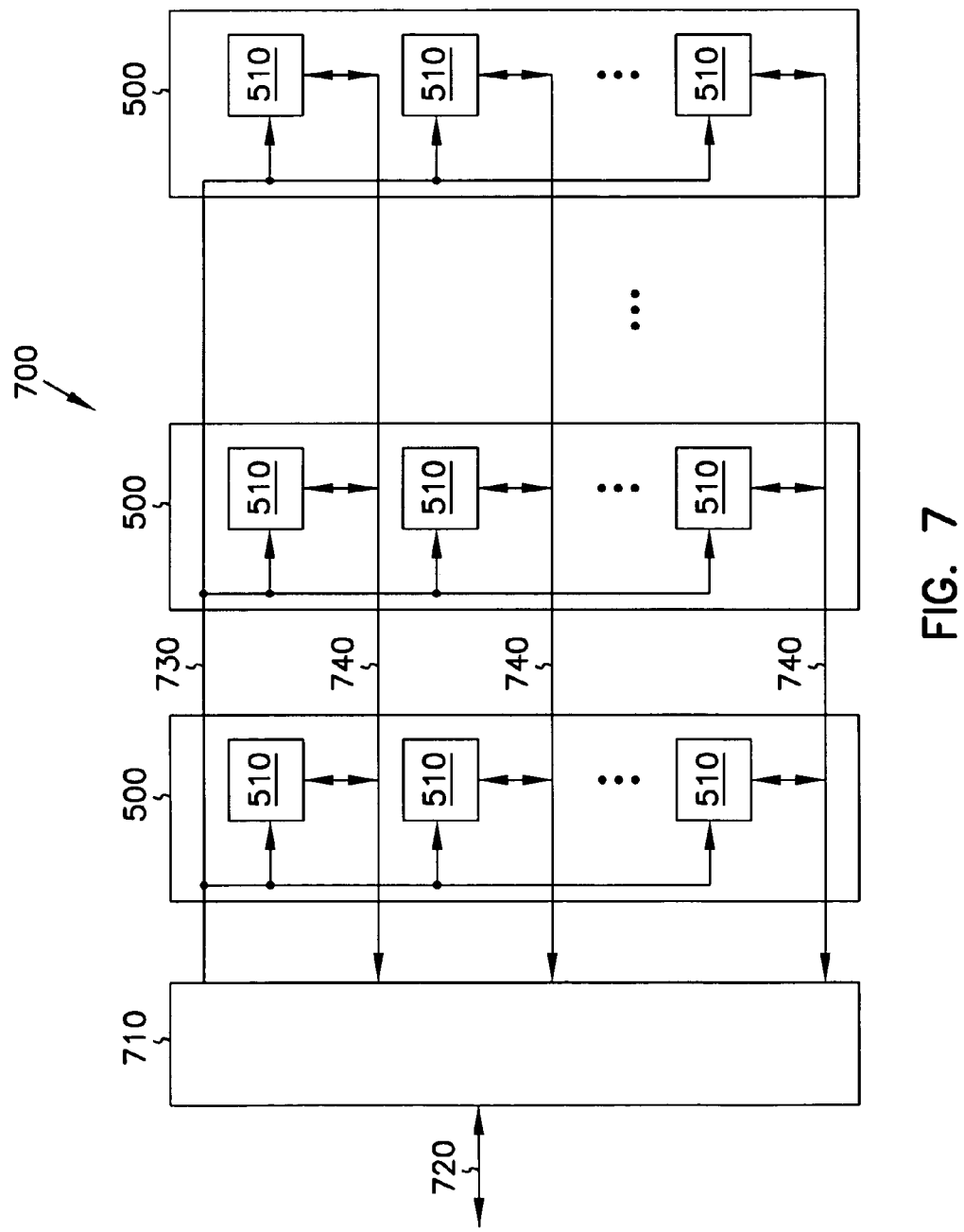
FIG. 7 is a block diagram of one embodiment of an exemplary memory system.

FIG. 7 shows one embodiment of an electronic system as memory system 700. Memory system 700 contains one or more memory modules 500 and a memory controller 710. Memory controller 710 provides and controls a bidirectional interface between memory system 700 and an external system bus 720. Memory system 700 accepts a command signal from the external bus 720 and relays it to the one or more memory modules 500 on a command link 730. Memory system 700 provides for data input and data output between the one or more memory modules 500 and external system bus 720 on data links 740.

Figure 8:
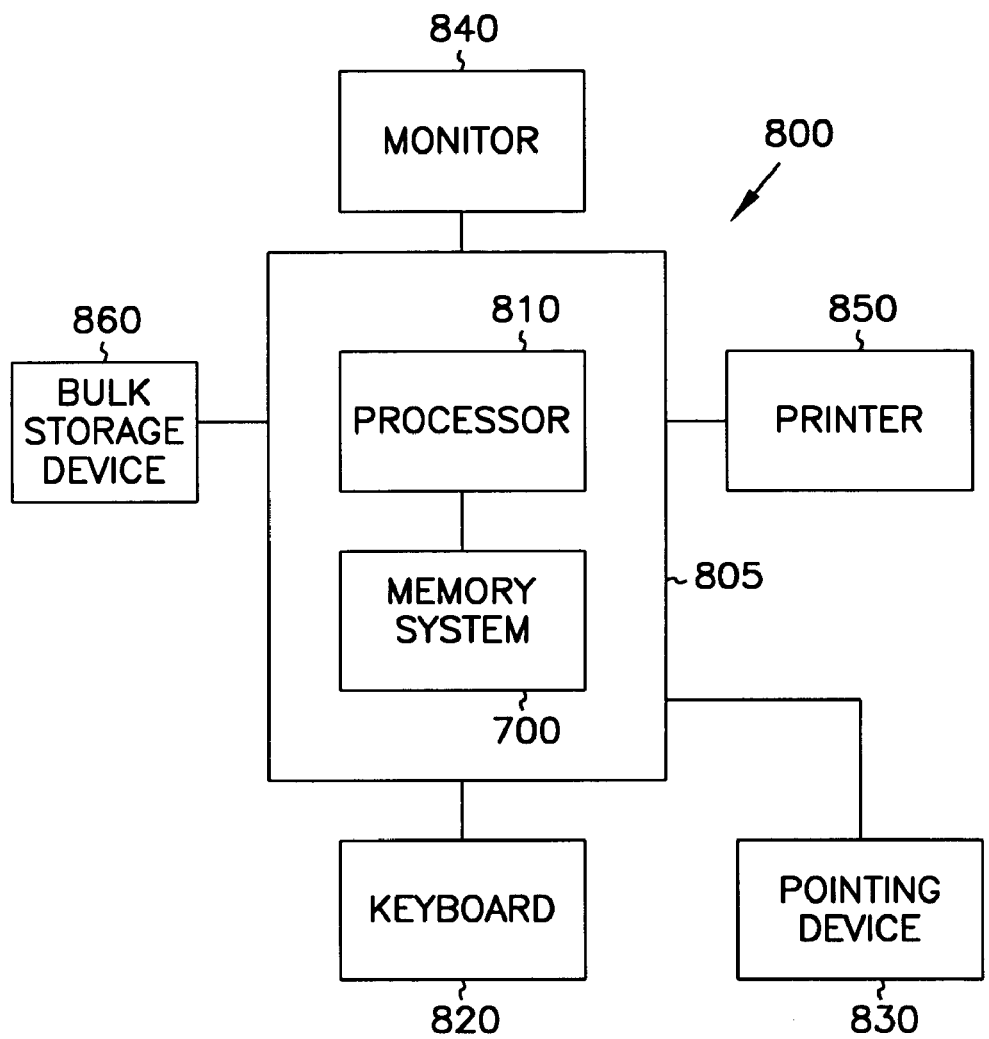
FIG. 8 is a block diagram of one embodiment of an exemplary computer system.

FIG. 8 shows a further embodiment of an electronic system as a computer system 800. Computer system 800 contains a processor 810 and a memory system 700 housed in a computer unit 805. Computer system 800 is but one example of an electronic system containing another electronic system, i.e., memory system 700, as a subcomponent. Computer system 800 optionally contains user interface components. Depicted in FIG. 8 are a keyboard 820, a pointing device 830, a monitor 840, a printer 850 and a bulk storage device 860. It will be appreciated that other components are often associated with computer system 800 such as modems, device driver cards, additional storage devices, etc. It will further be appreciated that the processor 810 and memory system 700 of computer system 800 can be incorporated on a single integrated circuit. Such single package processing units reduce the communication time between the processor and the memory circuit.

CONCLUSION

Chemical vapor deposition methods utilizing preheating of one or more of the reactant gases used to form deposited layers, chemical vapor deposition systems to perform the methods, and apparatus containing deposited layers produced using the methods have been described herein. The reactant gases include at least one chemical vapor deposition precursor. Heating one or more of the reactant gases prior to introduction to the reaction chamber may be used to improve physical characteristics of the resulting deposited layer, to improve the physical characteristics of the underlying substrate and/or to improve the thermal budget available for subsequent processing.

One example includes the formation of a titanium nitride layer with reactant gases including the precursors of titanium tetrachloride and ammonia. Preheating these reactant gases prior to introduction to the reaction chamber can reduce ammonium chloride levels in the resulting titanium nitride layer, thereby reducing or eliminating the need for post-processing to remove the ammonium chloride impurity. Chemical vapor deposition systems as described herein include one or more heaters to raise the temperature of the reactant gases prior to introduction to the reaction chamber.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. For example, a chemical vapor deposition system may further include a heater for a carrier gas to raise the temperature of the carrier gas prior to combination with a precursor gas or other reactant gas. Furthermore, the heated carrier gas may be combined with a first, unheated, reactant gas, with the heated carrier gas supplying the energy input necessary to raise the temperature of the combined reactant gas to a desired level in lieu of direct heating of the first reactant gas. Accordingly, this application is intended to cover any adaptations or variations of the invention. It is manifestly intended that this invention be limited only by the following claims and equivalents thereof.

What is claimed is:

1. A chemical vapor deposition system, comprising:
    a gas source;
    a reaction chamber;
    a gas conduit coupled between the gas source and the reaction chamber;
    a heater;
    a gas flow temperature sensor coupled to the gas conduit between the heater and the reaction chamber, the gas flow temperature sensor configured to sense a temperature of the heater and to derive a temperature of a flow of gases in the gas conduit based on the temperature of the heater and temperatures predicted from physical characteristics of the heater and the gases;
    a control system coupled to the gas flow temperature sensor and the heater, wherein the control system is adapted to adjust energy input from the heater to the gas conduit in response to data from the gas flow temperature sensor.

2. The chemical vapor deposition system of claim 1, further comprising:
    a second gas source;
    a second gas conduit coupled between the second gas source and the reaction chamber;
    a second heater;
    a second gas flow temperature sensor coupled to the second gas conduit between the second heater and the reaction chamber;
    wherein the control system is further coupled to the second gas flow temperature sensor and the second heater; and
    wherein the control system is further adapted to adjust energy input from the second heater to the second gas conduit in response to data from the second gas flow temperature sensor.

3. The chemical vapor deposition system of claim 1, further comprising:
    a gas flow control valve coupled to the gas conduit;
    wherein the control system is further coupled to the gas flow control valve; and
    wherein the control system is further adapted to control an opening of the gas flow control valve in response to data from the gas flow temperature sensor.

4. The chemical vapor deposition system of claim 1, wherein the reaction chamber has a bottom and side walls lined with quartz.

5. The chemical vapor deposition system of claim 1, wherein the heater is a heater selected from a group consisting of resistive heat tracing, IR radiation sources, electric heaters, and wrapped heat exchangers.

6. The chemical vapor deposition system of claim 1, wherein the chemical vapor deposition system further includes multiple wafer temperature sensors coupled to the control system.

7. The chemical vapor deposition system of claim 1, wherein the chemical vapor deposition system includes a jacket configured to provide insulation and to supply energy input, the jacket disposed on a portion of the gas conduit substantially immediately adjacent to the reaction chamber such that the flow of gases into the reaction chamber is through the jacket, the jacket configured to provide energy input to the flow of gases.

8. A chemical vapor deposition system, comprising:
    a gas source;
    a reaction chamber;
    a gas conduit coupled between the gas source and the reaction chamber;
    a heater;
    a gas flow temperature sensor coupled to the gas conduit between the heater and the reaction chamber, the gas flow temperature sensor configured to sense a temperature of the heater and to derive a temperature of a flow of gases in the gas conduit based on the temperature of the heater and temperatures predicted from physical characteristics of the heater and the gases;
    a gas flow control valve coupled to the gas conduit;
    a control system coupled to the gas flow temperature sensor, the heater and the gas flow control valve, wherein the control system is adapted to control at least one element selected from the group consisting of the heater and the gas flow control valve in response to data from the gas flow temperature sensor, wherein control of the heater comprises adjusting energy input from the heater to the gas conduit and control of the gas flow control valve comprises adjusting an opening of the gas flow control valve.

9. The chemical vapor deposition system of claim 8, wherein the reaction chamber has a bottom and side walls lined with quartz.

10. The chemical vapor deposition system of claim 8, wherein the heater is a heater selected from a group consisting of resistive heat tracing, IR radiation sources, electric heaters, and wrapped heat exchangers.

11. The chemical vapor deposition system of claim 8, wherein the chemical vapor deposition system further includes multiple wafer temperature sensors coupled to the control system.

12. The chemical vapor deposition system of claim 8, wherein the chemical vapor deposition system further includes a plurality of light sources located within the reaction chamber for heating a substrate mounted therein.

13. The chemical vapor deposition system of claim 8, wherein the chemical vapor deposition system includes a jacket configured to provide insulation and to supply energy input, the jacket disposed on a portion of the gas conduit substantially immediately adjacent to the reaction chamber such that the flow of gases into the reaction chamber is through the jacket, the jacket configured to provide energy input to the flow of gases.

14. A chemical vapor deposition system, comprising:
    a first gas source;
    a second gas source;
    a reaction chamber;
    a first gas conduit coupled to the first gas source;
    a second gas conduit coupled to the second gas source;

a first heater coupled to the first gas conduit;
a gas flow temperature sensor coupled to one or more portions of the first heater, the gas flow temperature sensor configured to sense a temperature of the one or more portions of the first heater and to derive a temperature of a gas flow in the first gas conduit based on the sensed temperatures of the one or more portions of the first heater and physical characteristics of the first heater, the first gas conduit, and gases in the gas flow;
a second heater coupled to the second gas conduit; and
a combination node having the first and second gas conduits as inputs and a third gas conduit as an output, wherein the third gas conduit is coupled to the reaction chamber.

15. The chemical vapor deposition system of claim 14, wherein the chemical vapor deposition system includes a jacket configured to provide insulation and to supply energy input, the jacket on at least a portion of the third gas conduit, the jacket disposed substantially immediately adjacent to the reaction chamber such that the flow of gases into the reaction chamber is through the jacket, the jacket configured to provide energy input to the flow of gases.

16. The chemical vapor deposition system of claim 14, wherein the first heater is a heater selected from a group consisting of resistive heat tracing, IR radiation sources, electric heaters, and wrapped heat exchangers.

17. The chemical vapor deposition system of claim 14, wherein the chemical vapor deposition system further includes multiple wafer temperature sensors coupled to a control system.

18. The chemical vapor deposition system of claim 14, wherein the chemical vapor deposition system further includes a plurality of light sources located within the reaction chamber for heating a substrate mounted therein.

19. The chemical vapor deposition system of claim 14, wherein the combination node includes a Y-fitting of piping making up the first, the second, and the third gas conduits.

20. The chemical vapor deposition system of claim 14, wherein the combination node includes a gas manifold allowing selection of gases from multiple gas sources.

21. The chemical vapor deposition system of claim 14, wherein the chemical vapor deposition system further includes a gas exhaust and vacuum system coupled to the reaction chamber and coupled to a control system by communication lines.

22. The chemical vapor deposition system of claim 14, wherein the third gas conduit contains a mixing element to provide homogeneity to gases introduced into the third gas conduit.

23. A chemical vapor deposition system, comprising:
a first gas source;
a second gas source;
a reaction chamber;
a first gas conduit coupled between the first gas source and the reaction chamber;
a second gas conduit coupled between the second gas source and the reaction chamber;
a first heater;
a second heater;
a first gas flow temperature sensor coupled to the first gas conduit, the first gas flow temperature sensor configured to sense a temperature of the first heater and to derive a temperature of a flow of gases in the first gas conduit based on the temperature of the first heater and temperatures predicted from physical characteristics of the first heater and the gases in the first gas conduit;
a second gas flow temperature sensor coupled to the second gas conduit, the second gas flow temperature sensor configured to sense a temperature of the second heater and to derive a temperature of a flow of gases in the second gas conduit based on the temperature of the second heater and temperatures predicted from physical characteristics of the second heater and the gases in the second gas conduit; and
a control system coupled to the first and second gas flow temperature sensors and the first and second heaters, wherein the control system is adapted to adjust energy input from the first heater to the first gas conduit in response to data from the first gas flow temperature sensor and to adjust energy input from the second heater to the second gas conduit in response to data from the second gas flow temperature sensor.

24. The chemical vapor deposition system of claim 23, wherein the reaction chamber has a bottom and side walls lined with quartz.

25. The chemical vapor deposition system of claim 23, wherein the first heater is a heater selected from a group consisting of resistive heat tracing, IR radiation sources, electric heaters, and wrapped heat exchangers.

26. The chemical vapor deposition system of claim 23, wherein the chemical vapor deposition system further includes multiple wafer temperature sensors coupled to the control system.

27. The chemical vapor deposition system of claim 23, wherein the chemical vapor deposition system further includes a plurality of light sources located within the reaction chamber for heating a substrate mounted therein.

28. The chemical vapor deposition system of claim 23, wherein the chemical vapor deposition system further includes a showerhead located in the reaction chamber coupled to the first gas conduit and to the second gas conduit.

29. The chemical vapor deposition system of claim 28, wherein the showerhead is a heated showerhead having separate flow channels for each gas of multiple gas flows.

30. The chemical vapor deposition system of claim 23, wherein the chemical vapor deposition system includes a jacket configured to provide insulation and to supply energy input, the jacket disposed substantially immediately adjacent to the reaction chamber such that flow of gases into the reaction chamber is through the jacket, the jacket configured to provide energy input to the flow of gases.

31. A chemical vapor deposition system, comprising:
a first gas source;
a second gas source;
a reaction chamber;
a first gas conduit coupled between the first gas source and the reaction chamber;
a second gas conduit coupled between the second gas source and the reaction chamber;
a first heater;
a second heater;
a first gas flow temperature sensor coupled to the first gas conduit, the first gas flow temperature sensor is configured to sense a temperature of the first heater and to derive a temperature of a flow of gases in the first gas conduit based on the temperature of the first heater and temperatures predicted from physical characteristics of the first heater and the gases in the first gas conduit;
a second gas flow temperature sensor coupled to the second gas conduit, the second gas flow temperature sensor is configured to sense a temperature of the second heater and to derive a temperature of a flow of gases in the second gas conduit based on the temperature of the second heater and temperatures predicted from physical characteristics of the second heater and the gases in the second gas conduit;

a control system coupled to the first and second gas flow temperature sensors and the first and second heaters, wherein the control system is adapted to adjust energy input from the first heater to the first gas conduit in response to data from the first gas flow temperature sensor and to adjust energy input from the second heater to the second gas conduit in response to data from the second gas flow temperature sensor; and a combination node having the first and second gas conduits as inputs and a third gas conduit as an output.

32. The chemical vapor deposition system of claim 31, wherein the chemical vapor deposition system includes a jacket configured to provide energy input, the jacket coupled to at least the third gas conduit, the jacket disposed substantially immediately adjacent to the reaction chamber such that flow of gases into the reaction chamber is through the jacket, the jacket configured to provide energy input to the flow of gases.

33. The chemical vapor deposition system of claim 32, wherein the jacket is further coupled to at least a portion of the first and second gas conduits.

34. The chemical vapor deposition system of claim 32, wherein the jacket is coupled to the control system, the control system configured to control the energy input by the jacket.

35. The chemical vapor deposition system of claim 32, wherein the jacket is configured to raise a temperature of gases in the third gas conduit.

36. The chemical vapor deposition system of claim 31, wherein the reaction chamber has a bottom and side walls lined with quartz.

37. The chemical vapor deposition system of claim 31, wherein the first heater is a heater selected from a group consisting of resistive heat tracing, IR radiation sources, electric heaters, and wrapped heat exchangers.

38. The chemical vapor deposition system of claim 31, wherein the chemical vapor deposition system further includes a plurality of light sources located within the reaction chamber for heating a substrate mounted therein.

39. The chemical vapor deposition system of claim 31, wherein the combination node includes a Y-fitting of piping making up the first, the second, and the third gas conduits.

40. The chemical vapor deposition system of claim 31, wherein the combination node includes a gas manifold allowing selection of gases from multiple gas sources.

41. The chemical vapor deposition system of claim 31, wherein the combination node is located in the reaction chamber.

42. The chemical vapor deposition system of claim 31, wherein the third gas conduit contains a mixing element to provide homogeneity to gases introduced into the third gas conduit.

43. The chemical vapor deposition system of claim 31, wherein the chemical vapor deposition system further includes a gas exhaust and vacuum system coupled to the reaction chamber and coupled to the control system by communication lines.

44. A chemical vapor deposition system, comprising:
a first gas source;
a second gas source;
a reaction chamber;
a first gas conduit coupled between the first gas source and the reaction chamber;
a second gas conduit coupled between the second gas source and the reaction chamber;
a first heater coupled to the first gas source through a first gas flow control valve;
a second heater coupled to the first gas source through a second gas flow control valve;
a first gas flow temperature sensor coupled to the first gas conduit, the first gas flow temperature sensor configured to sense a temperature of the first heater and to derive a temperature of a flow of gases in the first gas conduit based on the temperature of the first heater and temperatures predicted from physical characteristics of the first heater and the gases in the first gas conduit;
a second gas flow temperature sensor coupled to the second gas conduit, the second gas flow temperature sensor configured to sense a temperature of the second heater and to derive a temperature of a flow of gases in the second gas conduit based on the temperature of the second heater and temperatures predicted from physical characteristics of the second heater and the gases in the second gas conduit;
a combination node having the first and second gas conduits as inputs and a third gas conduit as an output;
a jacket configured to provide insulation and to supply energy input, the jacket coupled to at least the third gas conduit, the jacket disposed substantially immediately adjacent to the reaction chamber such that flow of gases into the reaction chamber is through the jacket, the jacket configured to provide energy input to the flow of gases; and
a control system coupled to the first and second gas flow temperature sensors, the first and second gas control values, and the first and second heaters, wherein the control system is adapted to adjust energy input from the first heater to the first gas conduit in response to data from the first gas flow temperature sensor and to adjust energy input from the second heater to the second gas conduit in response to data from the second gas flow temperature sensor.

45. The chemical vapor deposition system of claim 44, wherein the first heater is a heater selected from a group consisting of resistive heat tracing, IR radiation sources, electric heaters, and wrapped heat exchangers.

46. The chemical vapor deposition system of claim 44, wherein the chemical vapor deposition system further includes a plurality of light sources located within the reaction chamber for heating a substrate mounted therein.

47. The chemical vapor deposition system of claim 44, wherein the combination node includes a Y-fitting of piping making up the first, the second, and the third gas conduits.

48. The chemical vapor deposition system of claim 44, wherein the combination node includes a gas manifold allowing selection of gases from multiple gas sources.

49. The chemical vapor deposition system of claim 44, wherein the third gas conduit contains a mixing element to provide homogeneity to gases introduced into the third gas conduit.

50. The chemical vapor deposition system of claim 44, wherein the chemical vapor deposition system further includes a gas exhaust and vacuum system coupled to the reaction chamber and coupled to the control system by communication lines.

* * * * *

UNITED STATES PATENT AND TRADEMARK OFFICE
CERTIFICATE OF CORRECTION

PATENT NO. : 7,204,885 B2
APPLICATION NO. : 10/209840
DATED : April 17, 2007
INVENTOR(S) : Derderian et al.

It is certified that error appears in the above-identified patent and that said Letters Patent is hereby corrected as shown below:

In column 7, line 5, delete "maybe" and insert -- may be --, therefor.

In column 13, line 32, in Claim 1, after "gases;" insert -- and --.

In column 14, line 28, in Claim 8, after "conduit;" insert -- and --.

In column 18, line 34, in Claim 44, delete "values," and insert -- valves, --, therefor.

Signed and Sealed this

Twenty-fourth Day of July, 2007

JON W. DUDAS
*Director of the United States Patent and Trademark Office*